United States Patent
Liao et al.

(10) Patent No.: US 8,415,808 B2
(45) Date of Patent: Apr. 9, 2013

(54) SEMICONDUCTOR DEVICE WITH DIE STACK ARRANGEMENT INCLUDING STAGGERED DIE AND EFFICIENT WIRE BONDING

(75) Inventors: Chih-Chin Liao, Changhua (TW); Cheeman Yu, Madison, WI (US); Ya Huei Lee, Luzhou (TW)

(73) Assignee: SanDisk Technologies Inc., Plano, TX (US)

( * ) Notice: Subject to any disclaimer, the term of this patent is extended or adjusted under 35 U.S.C. 154(b) by 149 days.

(21) Appl. No.: 12/844,959

(22) Filed: Jul. 28, 2010

(65) Prior Publication Data
US 2012/0025396 A1    Feb. 2, 2012

(51) Int. Cl.
*H01L 23/48* (2006.01)

(52) U.S. Cl.
USPC .................................... 257/777; 257/E23.023

(58) Field of Classification Search .................. 257/777, 257/685, 686, 778–780, 781, 784, E23.023
See application file for complete search history.

(56) References Cited

U.S. PATENT DOCUMENTS

| | | | |
|---|---|---|---|
| 5,396,104 A | 3/1995 | Kimura | |
| 7,468,553 B2 | 12/2008 | Szewerenko et al. | |
| 7,612,436 B1 | 11/2009 | Lee et al. | |
| 7,704,794 B2 * | 4/2010 | Mess et al. | 438/112 |
| 2005/0067694 A1 | 3/2005 | Pon et al. | |
| 2006/0076690 A1 | 4/2006 | Khandros et al. | |
| 2008/0150111 A1 | 6/2008 | Hiller et al. | |
| 2008/0174000 A1 | 7/2008 | Chen et al. | |
| 2009/0051043 A1 | 2/2009 | Wong et al. | |
| 2009/0065951 A1 | 3/2009 | Cheah et al. | |
| 2009/0166829 A1 | 7/2009 | Nishiyama et al. | |
| 2009/0273096 A1 * | 11/2009 | Hiew et al. | 257/777 |
| 2009/0286356 A1 | 11/2009 | Mess et al. | |

OTHER PUBLICATIONS

European Search Report, European Patent Application No. 11250678.7.

* cited by examiner

*Primary Examiner* — (Vikki) Hoa B Trinh

(74) *Attorney, Agent, or Firm* — Vierra Magen Marcus LLP

(57) ABSTRACT

A semiconductor die package is disclosed. An example of the semiconductor package includes a first group of semiconductor die interspersed with a second group of semiconductor die. The die from the first and second groups are offset from each other along a first axis and staggered with respect to each other along a second axis orthogonal to the first axis. A second example of the semiconductor package includes an irregular shaped edge and a wire bond to the substrate from a semiconductor die above the lowermost semiconductor die in the package.

8 Claims, 15 Drawing Sheets

SEMICONDUCTOR DEVICE WITH DIE STACK ARRANGEMENT INCLUDING STAGGERED DIE AND EFFICIENT WIRE BONDING

BACKGROUND OF THE INVENTION

1. Field

The present technology relates to semiconductor packaging.

2. Description of Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated from so-called 3-D semiconductor devices. Such devices include for example a system-in-a-package (SiP) or a multichip module (MCM), where a plurality of die are mounted on a substrate in a stacked configuration. Edge views of conventional 3-D semiconductor packages 20 (without molding compound) are shown in prior art FIGS. 1 and 2. Typical packages include a plurality of semiconductor die 22 mounted to a substrate 26. In the examples shown, the die stack has four die, 22a, 22b, 22c and 22d. Further examples have more or less die in the stack. Although not shown in FIGS. 1 and 2, the semiconductor die 22 are formed with die bond pads on an upper surface of the die. Substrate 26 may be formed of an electrically insulating core sandwiched between upper and lower conductive layers. The upper and/or lower conductive layers may be etched to form conductance patterns including electrical leads and contact pads. Wire bonds 30 are thermosonically welded between the die bond pads of the semiconductor die 22 and the contact pads of the substrate 26 to electrically couple the semiconductor die to the substrate. The electrical leads on the substrate in turn provide an electrical path between the die and a host device. Once electrical connections between the die and substrate are made, the assembly is then typically encased in a molding compound to provide a protective package.

It is known to stack semiconductor die 22 on top of each other either with an offset configuration (prior art FIG. 1) or in an aligned configuration (prior art FIG. 2). In the offset configuration of FIG. 1, the die 22 are stacked with an offset so that the bond pads of the next lower die are left exposed and accessible to a wire bonding device. Such configurations are shown for example in U.S. Pat. No. 6,359,340 to Lin, et al., entitled, "Multichip Module Having a Stacked Chip Arrangement," which patent is incorporated herein by reference in its entirety. An offset configuration provides an advantage of convenient access to the bond pads on each of the semiconductor die. However, the offset requires a greater footprint on the substrate, where space is at a premium.

In the aligned configuration of prior art FIG. 2, the semiconductor die 22 are stacked directly on top of each other, thereby taking up less footprint on the substrate as compared to an offset configuration. However, in an aligned configuration, space must be provided between adjacent semiconductor die for the bond wires 30. In addition to the height of the bond wires 30 themselves, additional space must be left above the bond wires, as contact of the bond wires 30 of one die with the next die above may result in an electrical short. As shown in FIG. 2, it is therefore known to provide dielectric spacer layers 34 to provide enough room for the bond wires 30 to be bonded between adjacent die 22. The requirement of the spacer layers adds height to the die stack and is a limiting factor in the number of die which may be included in the stack to still fit within the height of a standard memory card form factor.

While the wiring configuration shown in prior art FIGS. 1 and 2 may be possible for semiconductor with smaller numbers of die in the die stack, wiring of the die in die stacks of greater than four die becomes more problematic. In addition to vertical wire bonds, wire bonds may need to be made diagonally and/or additional substrate contact pads may be required. Prior art FIGS. 3 and 4 are top and side views of a typical NAND semiconductor package 20 (without molding compound) including eight die mounted to a substrate 26. FIG. 3 shows arbitrary x-y axes. Conventionally, the die 22 are stacked one atop another in an offset along the x-axis starting with die 0 and proceeding sequentially to die 7.

As noted, the substrate 26 includes contact pads, such as contact pads 38 shown in prior art FIG. 3. A die stack including a large number of die may need two sets of contact pads 38 to affect the input/output (I/O) to the die in the stack. In the example of FIGS. 3 and 4, the corresponding die bond pads 40 on respective die 0-3 are connected to each other, and to a first set of contact pads 38a on substrate 26 via a set of wire bonds 30a extending from bond pads 40 of die 0 to the contact pads 38a. As used herein, "corresponding" die bond pads on different die refer to die bond pads on different die that are aligned with each other along the y-axis. Thus, from the perspective of FIG. 3, the first (bottom-most) die pad on each die 0-3 correspond with each other and are wire bonded together, the second bottom-most die pad on each of die 0-3 correspond with each other and are wire bonded together, etc.

Similarly, corresponding die bond pads 40 on respective die 4-7 are connected to each other, and to a second set of contact pads 38b on substrate 26 via a set of wire bonds 30b extending from bond pads 40 of die 4 to the contact pads 38b. In the embodiment shown, the contact pads 38a may alternate with the contact pads 38b on the substrate. With such a wiring configuration, wire length for the wire bonds will be long, and wire-to-wire spacing between die in the stack may become smaller to the point where electrical shorting between wires occurs. This results in package failure and an adverse affect on assembly yield.

To minimize the above-described problems, die-stack rotation is employed as shown in the top and side views of prior art FIGS. 5 and 6. In the example of FIGS. 5 and 6, a first set of die 0-3 are offset stacked in a first direction, and connect to a set of contact pads 38a on a first side of the substrate 26 via wire bonds 30a. A second set of die 4-7 are offset stacked in a second direction opposite the first direction, and connect to a set of contact pads 38b on a second side of the substrate 26 opposite the first side via wire bonds 30b.

One drawback with die-stack rotation is that the first set of die 0-3 are attached and wire bonded, and then the second set of die 4-7 are attached and wire bonded. The multiple die attach and wire bonding processes increase cycle time, and cause lower assembly yield due to more handling of the semiconductor packages during fabrication. There is a need for a die stack design allowing two sets of die to wire bond to two sets of contact pads on the substrate, while avoiding the above-described problems.

Another drawback to conventional stacked packages is exposure of bond wires outside of the final encapsulated package. This problem is specific to memory packages with irregular package outlines, such as microSD and MsMicro. Prior art FIGS. 7 through 9 show an example of a stacked die in a microSD memory package 20. FIGS. 7 and 9 further show a controller die 50 atop the die stack. The die stack may be assembled using die-stack rotation as described above and as shown in FIG. 9. In such embodiments, a substrate may have contact pads 38a along a first edge of the package which align with adjacent die bond pads of the first set of die as shown along edge 40 in FIG. 7. However, given the irregular shape of the package, for example along edge 42 of the package 20, some die bond pads are connected to contact pads 38b which are diagonally spaced away from their connected die bond pads. FIG. 8 shows an enlarged view of area 8-8 in FIG. 7. When the substrate is encapsulated and singulated in the final shape of the package, one or more wire bonds (such as wire bond 30a) along the irregular shaped edge 42 may reside outside of the encapsulation, or otherwise impermissibly close to the package edge. There is a need for a die stack design allowing efficient wire bonding along an irregular shaped edge of a package without exposing wires outside of the finished, encapsulated package.

DETAILED DESCRIPTION

Embodiments will now be described with reference to FIGS. 10 through 24, which relate to a semiconductor device with a die stack arrangement including staggered die and/or efficient wire bonding. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top," "bottom," "upper," "lower," "vertical" and/or "horizontal" are used herein for convenience and illustrative purposes only, and are not meant to limit the description of the invention inasmuch as the referenced item can be exchanged in position.

Figure 10:
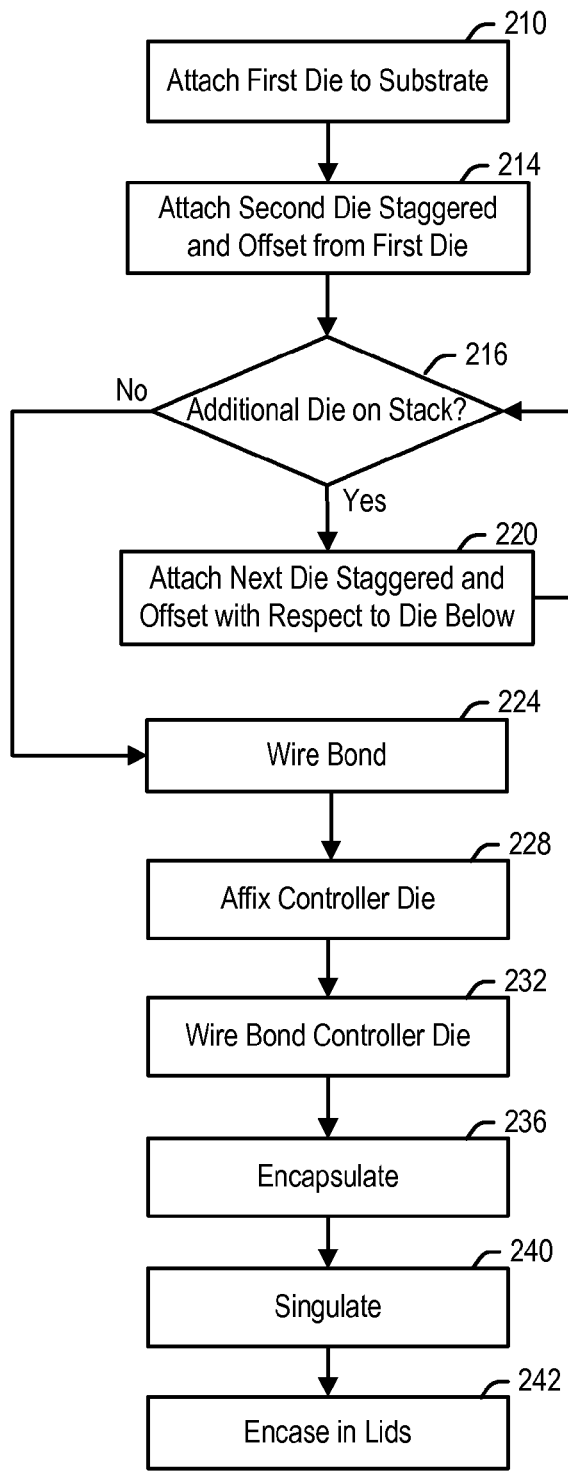
FIG. 10 is a flowchart for assembling a semiconductor package according to an embodiment of the present invention.

The process for forming a semiconductor package 100 in accordance with an embodiment of the present system will now be described with reference to the flowchart of FIG. 10, and the various views of FIGS. 11 through 19 which show the package 100 in various stages of fabrication. Referring initially to the top and perspective views of FIGS. 11 and 12, a first semiconductor die 102a may be mounted on a substrate 120 in a step 210. The die 102a may be mounted to substrate 120 via a die attach adhesive in a known adhesive or eutectic die bond process.

Die 102a may include die bond pads 104 formed along an edge 106 of die 102a. It is understood that the number of die bond pads 104 shown is by way of example and there may be more or less die bond pads 104 in die 102a in further embodiments. In embodiments, the die 102a may be a memory die, such as a NAND flash memory die. However, the die 102a can be other types of semiconductor die in further embodiments, such as for example, NOR, DRAM and various other memory die.

Although not shown, substrate 120 may be part of a panel of substrates so that the semiconductor packages according to the present technology may be batch processed for economies of scale. Although fabrication of a single semiconductor package is described below, it is understood that the following description may apply to all packages formed on the substrate panel. The substrate 120 may be a variety of different chip carrier mediums, including a printed circuit board (PCB), a leadframe or a tape automated bonded (TAB) tape. Where substrate 120 is a PCB, the substrate may be formed of a core having top and/or bottom conductive layers formed thereon. The core may be various dielectric materials such as for example, polyimide laminates, epoxy resins including FR4 and FR5, bismaleimide triazine (BT), and the like.

The conductive layers may be formed of copper or copper alloys, plated copper or plated copper alloys, Alloy 42 (42FE/58NI), copper plated steel or other metals or materials known for use on substrates. The conductive layers may be etched into a conductance pattern as is known for communicating signals between the semiconductor die 102 and an external device (not shown). Substrate 120 may additionally include exposed metal portions forming contact pads 122 on an upper surface of the substrate 120. The number of contact pads 122 shown is by way of example only, and there may be more or less contact pads in further embodiments. Where the semiconductor package is a land grid array (LGA) package, contact fingers (not shown) may also be defined on a lower surface of the substrate 120. The contact pads 122 and/or contact fingers may be plated with one or more gold layers, for example in an electroplating process as is known in the art.

The contact pads 122 along an edge 124 of substrate 120 may be provided in two groups: contact pads 122a and contact pads 122b. In embodiments, the contact pads 122a alternate with contact pads 122b. As explained below, contact pads 122a connect with a first group of semiconductor die, and contact pads 122b connect with a second group of semiconductor die.

Figure 11:
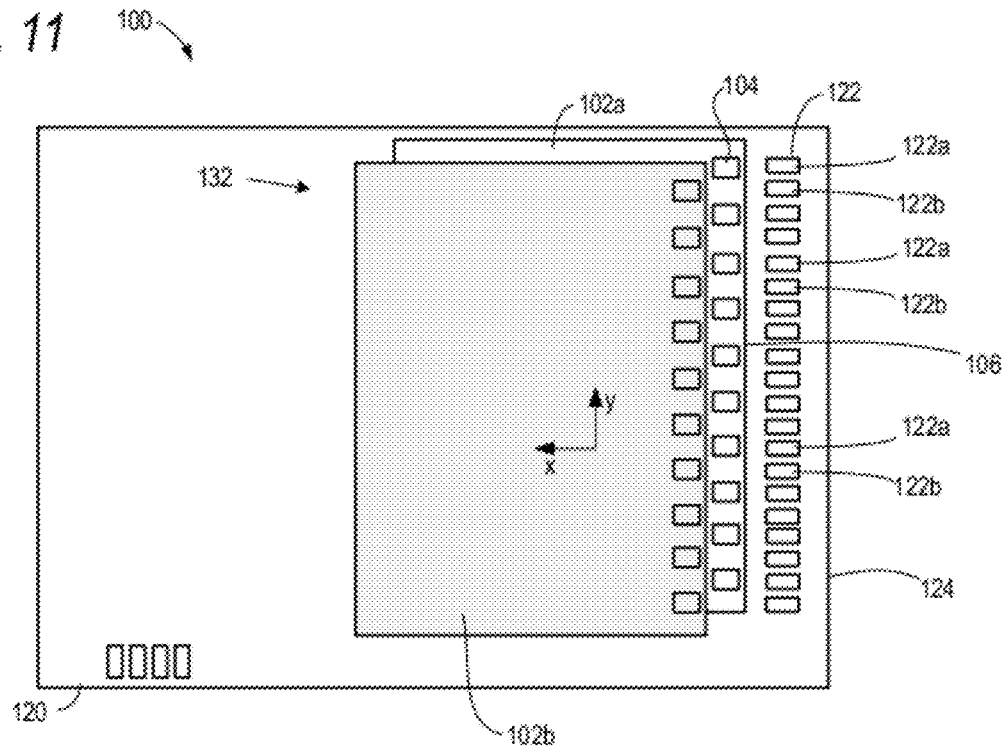
FIG. 11 is a top view of a semiconductor package during a first phase of fabrication according to the present technology.
Figure 12:
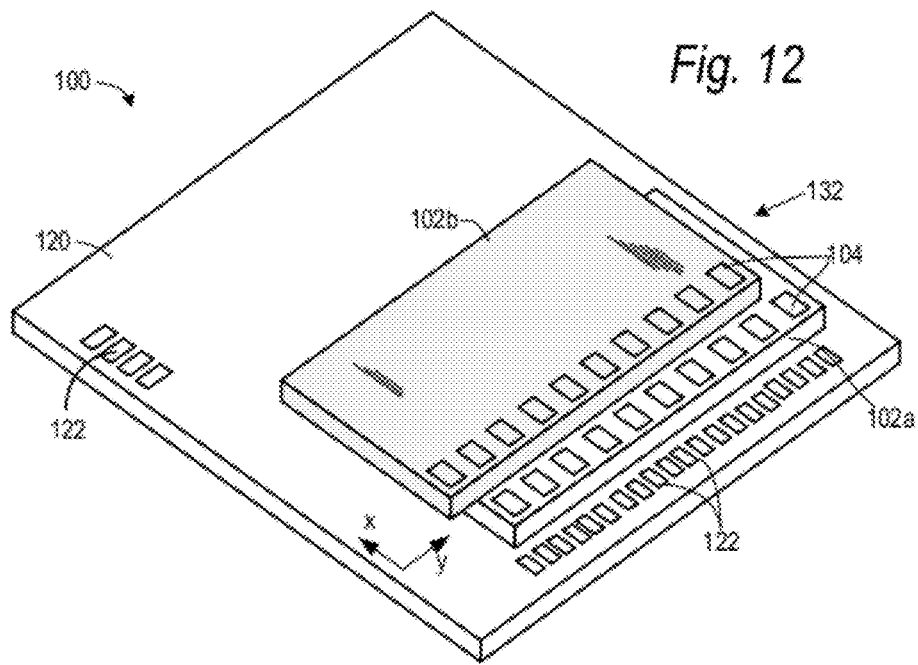
FIG. 12 is a perspective view of a semiconductor package during a first phase of fabrication according to the present technology.

In step 214, a second die 102b may be stacked on die 102a as shown in the top and perspective views of FIGS. 11 and 12. The die 102b may be an identical memory die to die 102a and may include a like number of die bond pads 104 (though the die 102b is shown slightly shaded for clarity and distinction from die 102a in the figures). It is contemplated that die 102a and 102b need not have identical configurations in further embodiments. The die 102b may be affixed in a staggered and offset orientation with respect to die 102a. That is, the die 102b may be staggered with respect to the die 102a along a y-axis, and offset with respect to the die 102a along an x-axis.

The die 102b may be staggered so that the die bond pads 104 of die 102b align between the die bond pads 104 of die 102a (and vice-versa). In one embodiment, the die 102b may be shifted downward relative to die 102a one-half the distance (along the y-axis) between adjacent die bond pads 104 (center-to-center) to provide the staggered position. The die 102b may also be offset relative to die 102a by a distance (along the x-axis) so that a conventional wire bonding device may access and attach bond wires to the die bond pads 104 of die 102a.

While the die 102b is shown staggered in the negative y-direction (downward in FIG. 11) with respect to die 102a, it may be staggered in the positive y-direction in further embodiments with the provision that the bond pads 104 of die 102a lie between the die bond pads 104 of die 102b.

Figure 13:
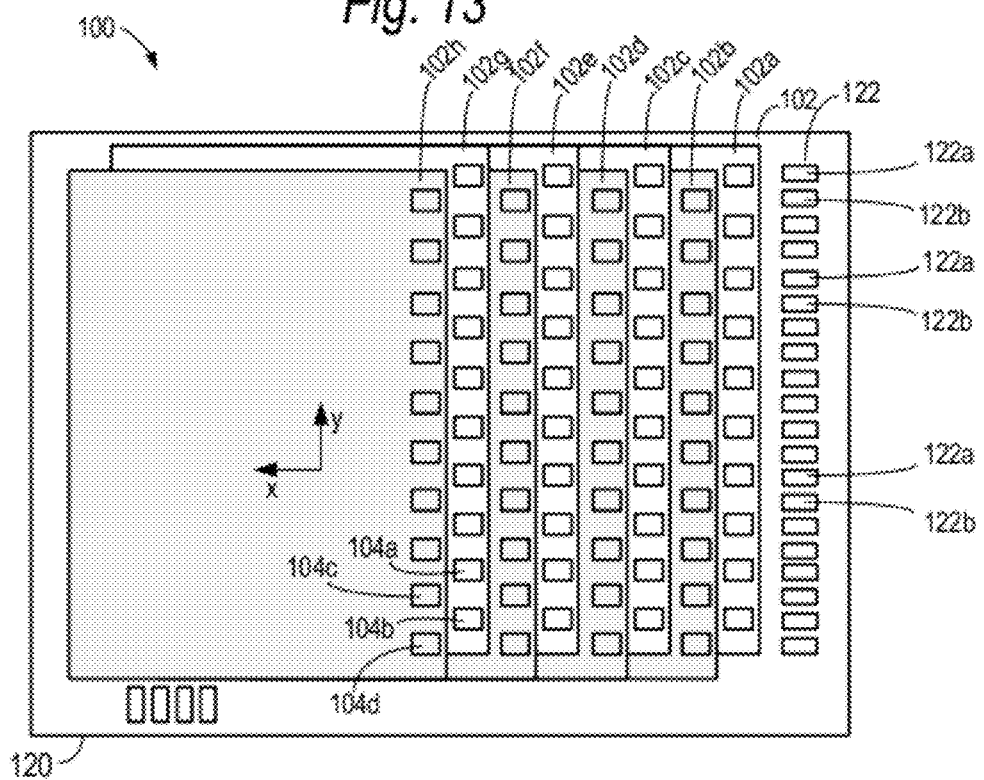
FIG. 13 is a top view of a semiconductor package during a second phase of fabrication according to the present technology.
Figure 14:
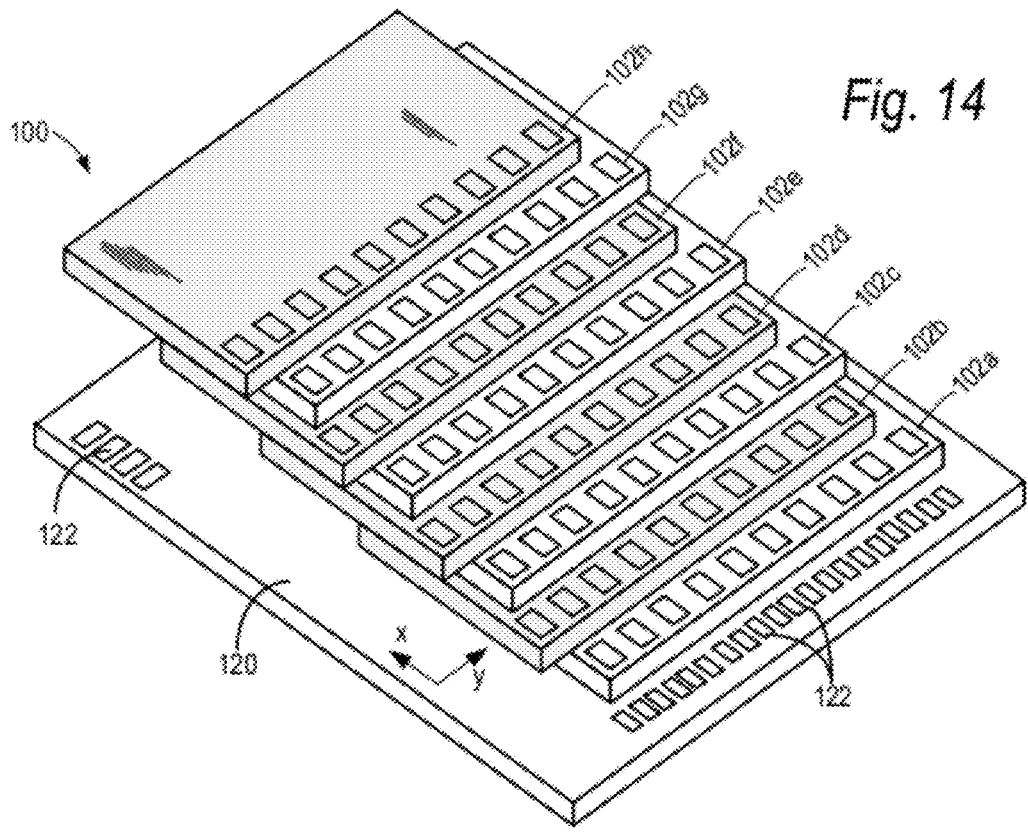
FIG. 14 is a perspective view of a semiconductor package during a second phase of fabrication according to the present technology.

The die 102a and 102b together form a die stack 132. In different embodiments, the die stack 132 may have differing numbers of die. Referring again to the flowchart of FIG. 10, at step 216 if there are additional die to be added to the stack 132, the additional die are added in step 220. For example, FIGS. 13 and 14 show top and perspective views of a die stack 132 including eight semiconductor die 102a through 102h. It is understood that die stack 132 may include a fewer or greater number of die in further embodiments.

When adding a new die to the stack, the new die is staggered and offset with respect to the die on which it is mounted. As indicated above, die 102b was staggered downward along the y-axis with respect to die 102a in this embodiment. Thus, die 102c may be added on top of die 102b staggered upward along the y-axis so that the die bond pads of the die 102b are positioned in between the die bond pads 104 of die 102c (and vice-versa). In embodiments, the die 102c may be aligned along the y-axis directly over die 102a (but offset along the x-axis). All remaining die added to the die stack may similarly be added in a staggered and offset fashion with respect to the die on which it is mounted.

Each die 102b through 102h may be offset by a constant amount along the x-axis relative to the die on which it is mounted. Additionally, each die 102b through 102h may be alternatingly staggered upward and downward along the y-axis relative to the die on which it is mounted. This pattern of staggering may result in a first group of die (102a, 102c, 102e, 102g) which are staggered upward, and aligned with each other along the y-axis. This pattern of staggering may also result in a second group of die (102b, 102d, 102f, 102h) which are staggered downward, and aligned with each other, along the y-axis.

Figure 1:
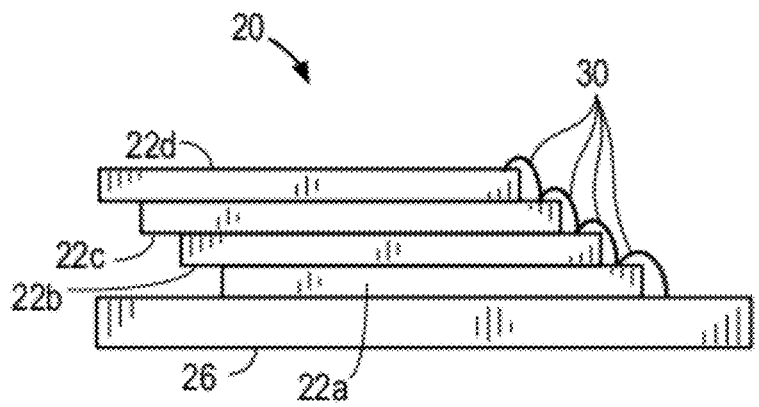
FIG. 1 is a prior art edge view of a conventional semiconductor device including semiconductor die stacked in an offset relation.
Figure 2:
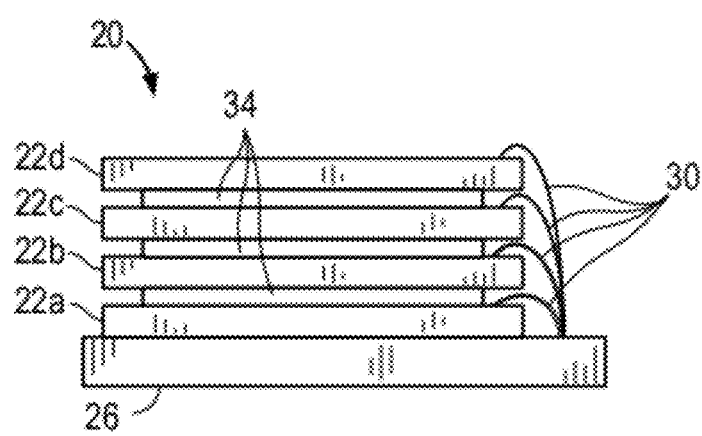
FIG. 2 is a prior art edge view of a conventional semiconductor device including semiconductor die stacked in an aligned relation and separated by spacer layers.
Figure 3:
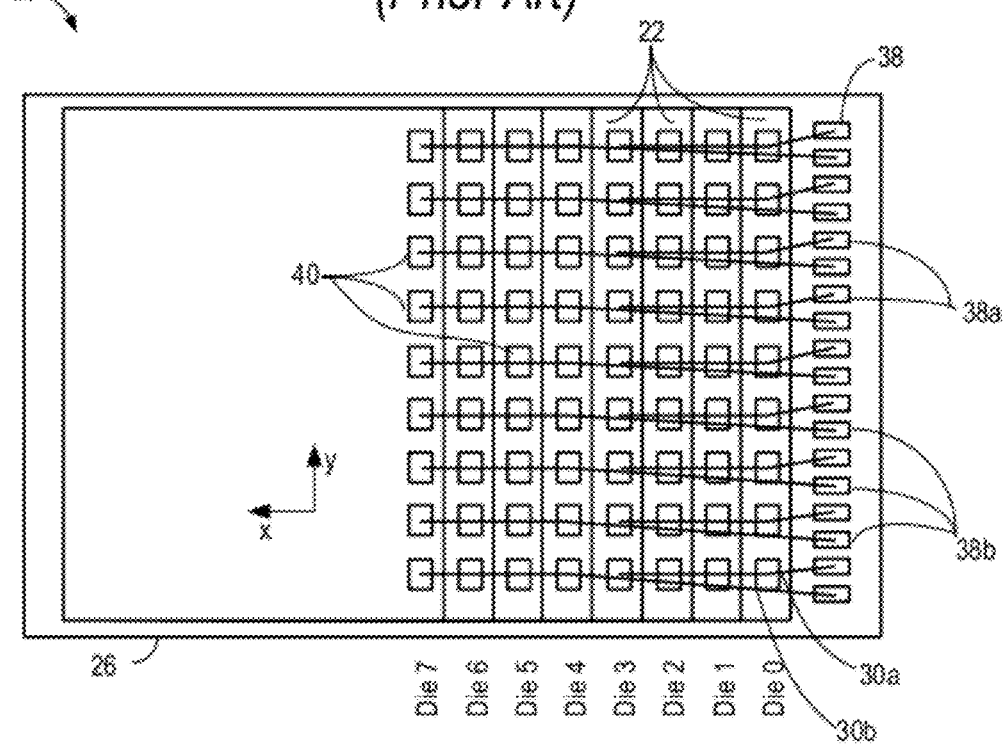
FIG. 3 is a prior art top view of a semiconductor die stack, including eight semiconductor die wire bonded to a substrate.
Figure 4:
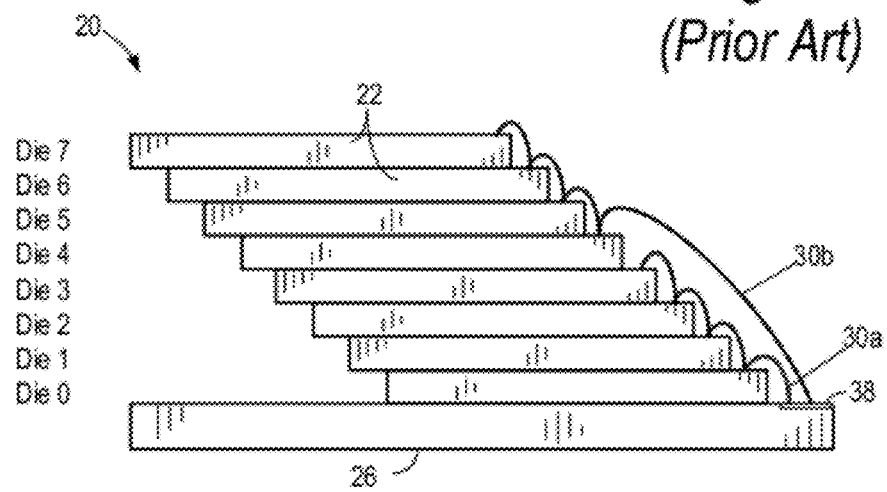
FIG. 4 is a prior art side view of the semiconductor die stack shown in FIG. 3.
Figure 5:
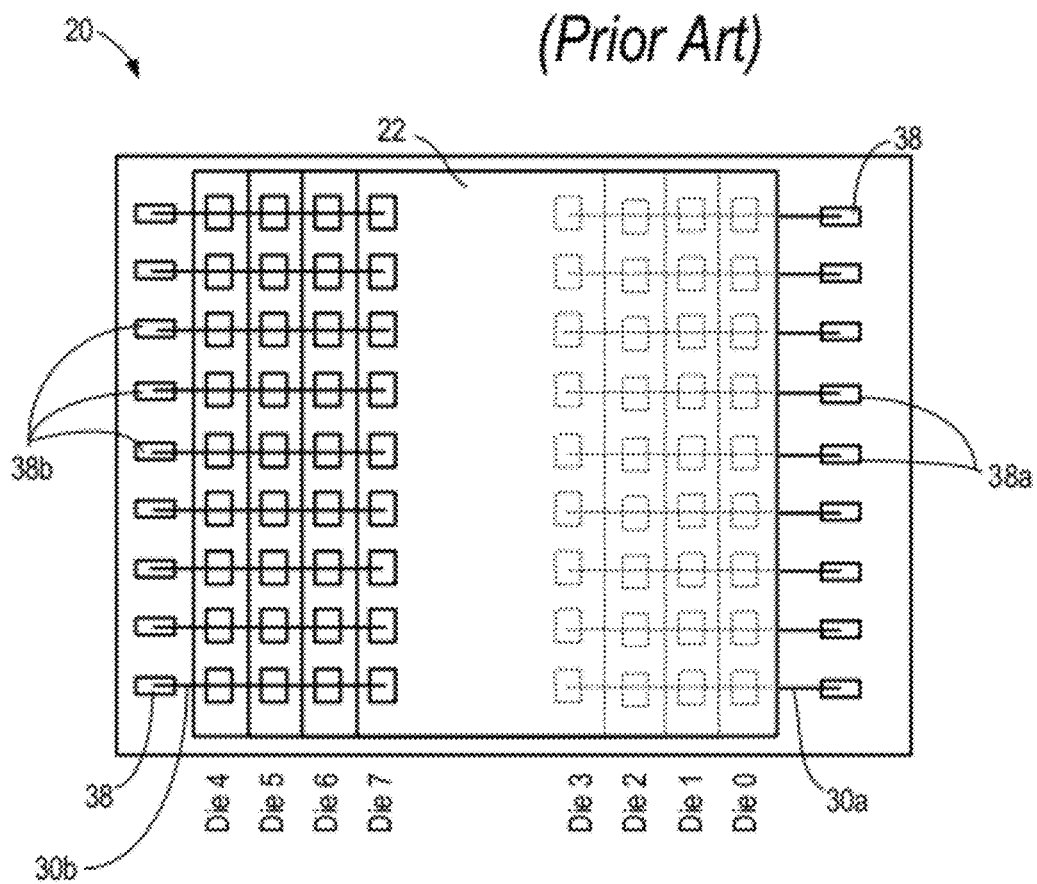
FIG. 5 is a prior art top view of a rotated die stack, including eight semiconductor die.
Figure 6:
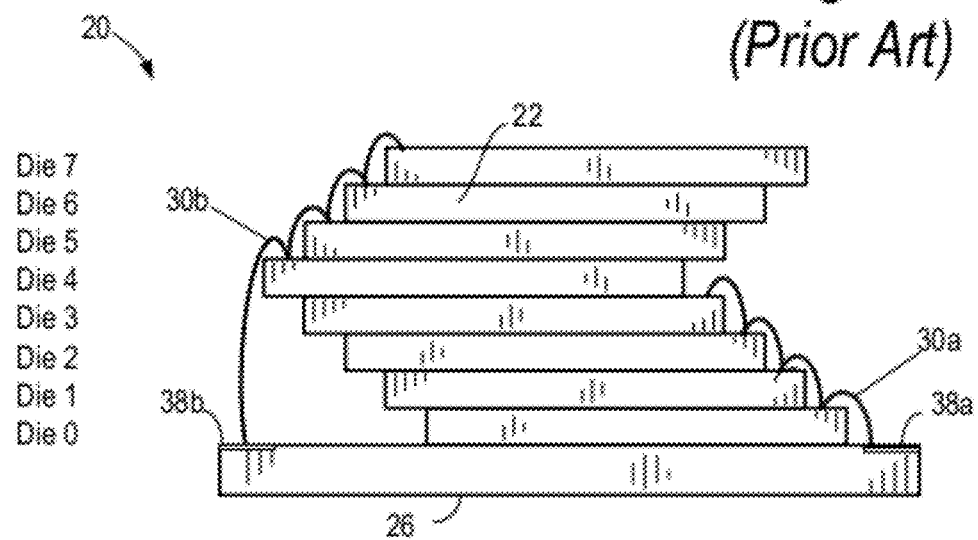
FIG. 6 is a prior art side view of a rotated die stack shown in FIG. 5.
Figure 7:
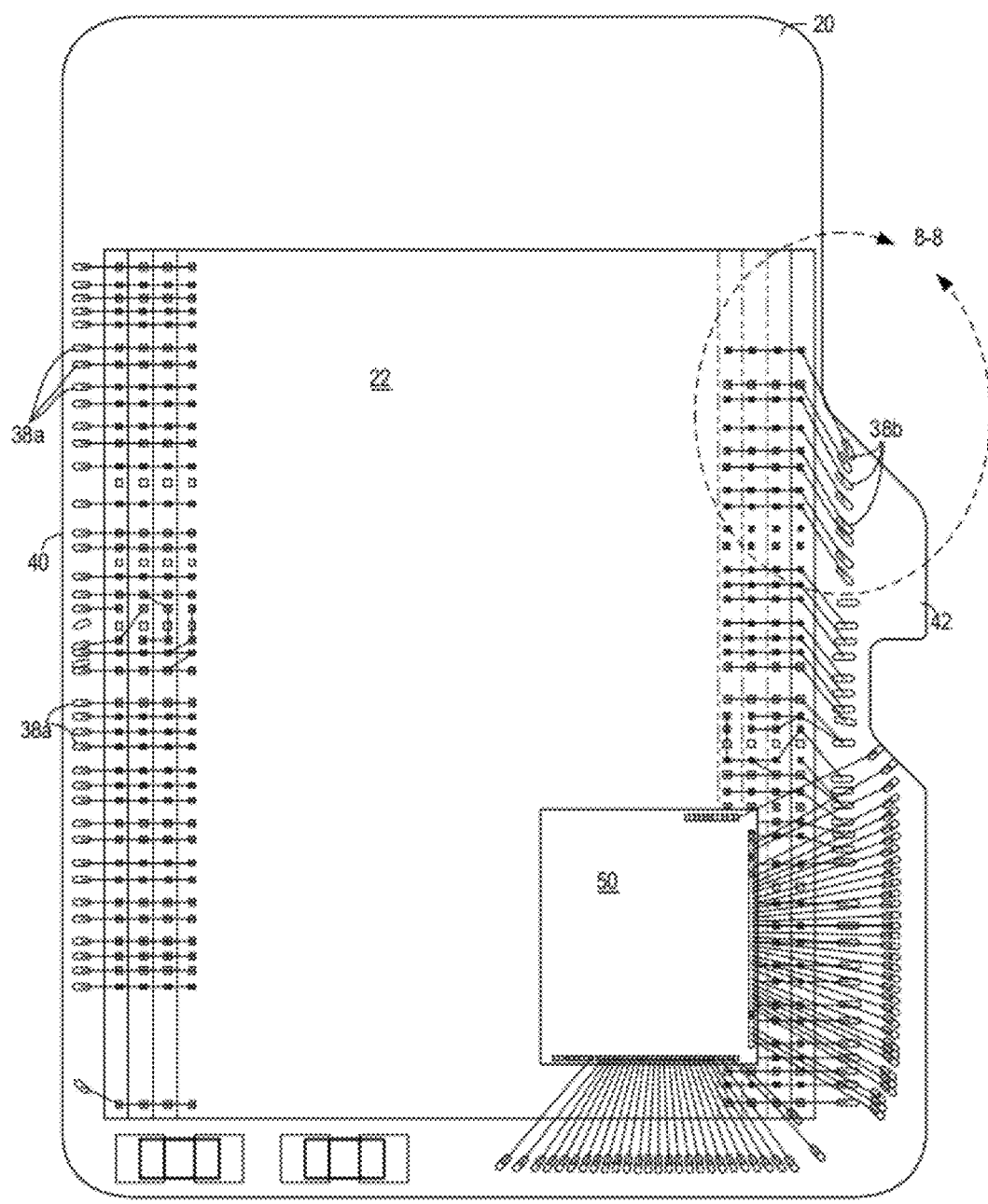
FIG. 7 is a prior art top view of an irregular shaped semiconductor die package.

As discussed above, for example with respect to prior art FIGS. 3 and 4, the die in a conventional stack may be mounted one atop another in an offset starting with die 0 and proceeding sequentially to die 7 (in an eight die stack). As is known, in order to uniquely address each die in the stack, certain die bond pads on each die are used as chip address pins. For a given die in the stack, a low voltage to one of the address pins represents a logical zero and a high voltage to one of the address pins represents a logical one. Thus, using, for example, three address pins on each die, each die in a conventional eight die stack may be uniquely addressed sequentially from 000 (die 0) at the bottom of the stack through 111 (die 7) at the top of the stack.

In accordance with an embodiment of the present system, the first and second groups of die may be interspersed with each other so that the numbering of the die in the stack 132 is as shown in Table 1 below.

TABLE 1

| Stack Bottom: | die 0 (102a) |
| --- | --- |
| | die 4 (102b) |
| | die 1 (102c) |
| | die 5 (102d) |
| | die 2 (102e) |
| | die 6 (102f) |
| | die 3 (102g) |
| Stack Top: | die 7 (102h) |

As noted above, the die are alternatingly staggered, so that, with the above ordering of die in the stack, the first group of y-axis-aligned die 102a, 102c, 102e and 102g includes die 0 through die 3, sequentially. Similarly, the second group of y-axis-aligned die 102b, 102d, 102f and 102h includes die 4 through die 7, sequentially.

It is understood that the die in the die stack may be ordered differently in further embodiments of the present technology.

For example, Table 2 shows further examples of the order of die in embodiments having eight die in die stack 132.

TABLE 2

| Stack Bottom: | die 0 (102a) | die 4 (102a) | die 0 (102a) | die 7 (102a) |
|---|---|---|---|---|
| | die 1 (102b) | die 0 (102b) | die 1 (102b) | die 3 (102b) |
| | die 2 (102c) | die 5 (102c) | die 4 (102c) | die 6 (102c) |
| | die 3 (102d) | die 1 (102d) | die 5 (102d) | die 2 (102d) |
| | die 4 (102e) | die 6 (102e) | die 2 (102e) | die 5 (102e) |
| | die 5 (102f) | die 2 (102f) | die 3 (102f) | die 1 (102f) |
| | die 6 (102g) | die 7 (102g) | die 6 (102g) | die 4 (102g) |
| Stack Top: | die 7 (102h) | die 3 (102h) | die 7 (102h) | die 0 (102h) |

Other sequences of die in die stack 132 are contemplated.

Figure 15:
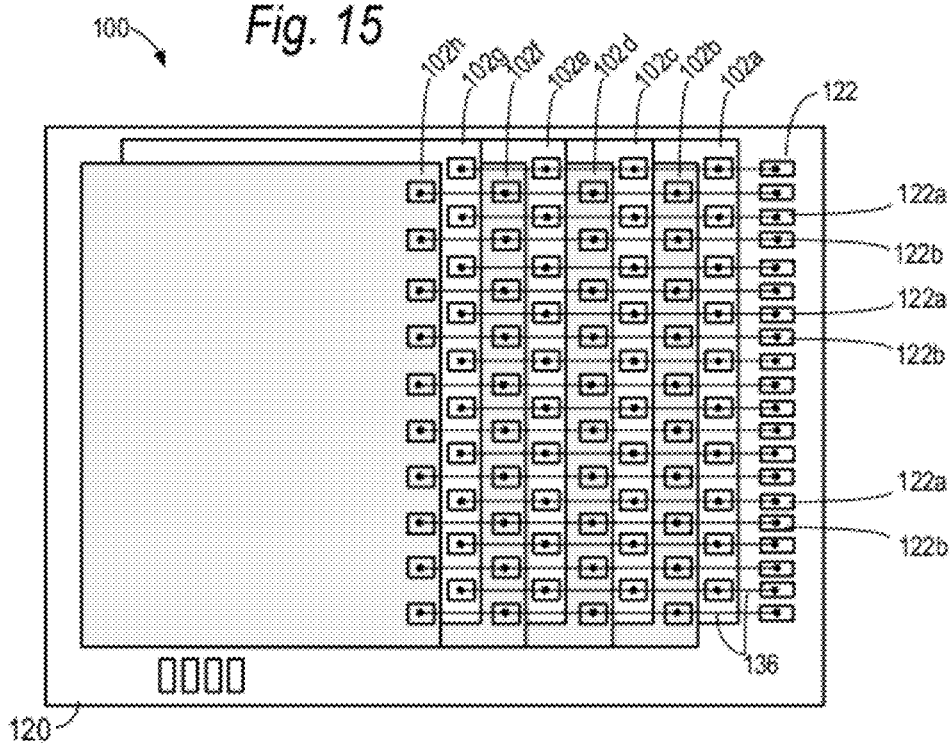
FIG. 15 is a top view of a semiconductor package during a third phase of fabrication according to the present technology.
Figure 16:
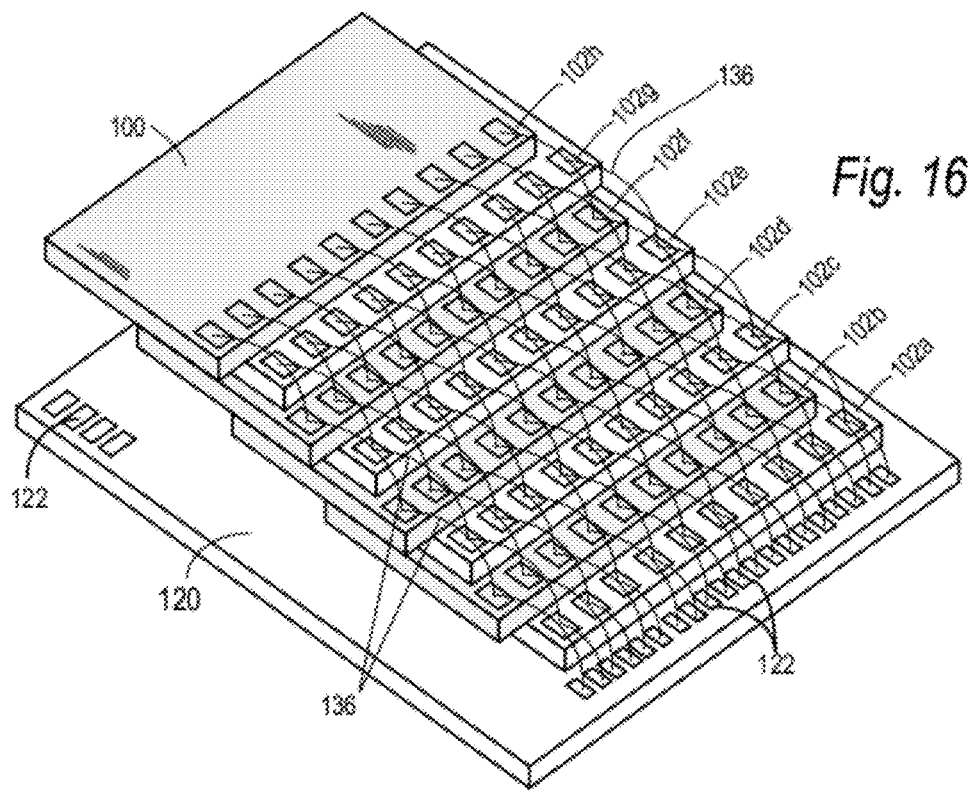
FIG. 16 is a perspective view of a semiconductor package during a third phase of fabrication according to the present technology.

Referring now to the top and perspective views of FIGS. 15 and 16, the die in the die stack 132 may be wire bonded to the substrate 120 in step 224 using wire bonds 136. In particular, the die 102a, 102c, 102e and 102g in the first group may be wire bonded such that the corresponding die bond pads 104 (along the y-axis) on each die in the group may be wire bonded together. The bottom die in the first group (die 102a) may be wire bonded to the first group of contact pads 122a on substrate 120. Similarly, the die 102b, 102d, 102f and 102h in the second group may be wire bonded together such that the corresponding die bond pads 104 (along the y-axis) on each die in the group may be wire bonded together. The bottom die in the first group (die 102b) may be wire bonded to the second group of contact pads 122b on substrate 120.

The wire bond process may be performed in a single pass across the y-axis of the die stack so that a first set of corresponding bond pads on the first group of die are wire bonded, a first set of corresponding bond pads on the second group of die are wire bonded, a second set of bond pads on the first group of die are wire bonded, a second set of bond pads on the second group of die are wire bonded, and so on until all of the wire bonds shown in FIGS. 15 and 16 are made. Alternatively, all of the wire bonds for the first group of die may be made, and then all of the wire bonds for the second group of die may be made (or vice-versa). The wire bonds 136 may be made in a forward or reverse wire bond process.

As the first and second groups of die are staggered along the y-axis, the first group may be wire bonded to each other and the second group may be wire bonded to each other without electrical shorting of the bond wires between the two groups. Thus, the embodiment of the present technology shown for example in FIGS. 15 and 16 allows two separate groups of die to be wire bonded to each other and the substrate while avoiding the problems found in the prior art. Namely, the first and second groups may be wire bonded separately to the substrate while minimizing wire lengths and preventing electrical shorts. Moreover, the wire bonding process of all die in the stack may be performed in a single pass, after all die are mounted in the stack. This avoids the increased cycle times and decreased yield found in die-stack rotation where multiple die attach and wire bond processes are performed.

In the above-described embodiments, the wire bonds 136 may be uncoated gold, though they may alternatively be copper, aluminum or other metals. In a further embodiment of the present system, the wire bonds may be pre-insulated with polymeric insulation that makes the surface of the wire electrically non-conductive. Two examples of a pre-insulated wire bond which is suitable for use in the present system are disclosed in U.S. Pat. No. 5,396,104, entitled, "Resin Coated Bonding Wire, Method Of Manufacturing The Same, And Semiconductor Device," and U.S. Published Patent Application No. 2004/0124545, entitled, "High Density Integrated Circuits And The Method Of Packaging the Same," both of which are incorporated by reference herein in their entirety.

Figure 17:
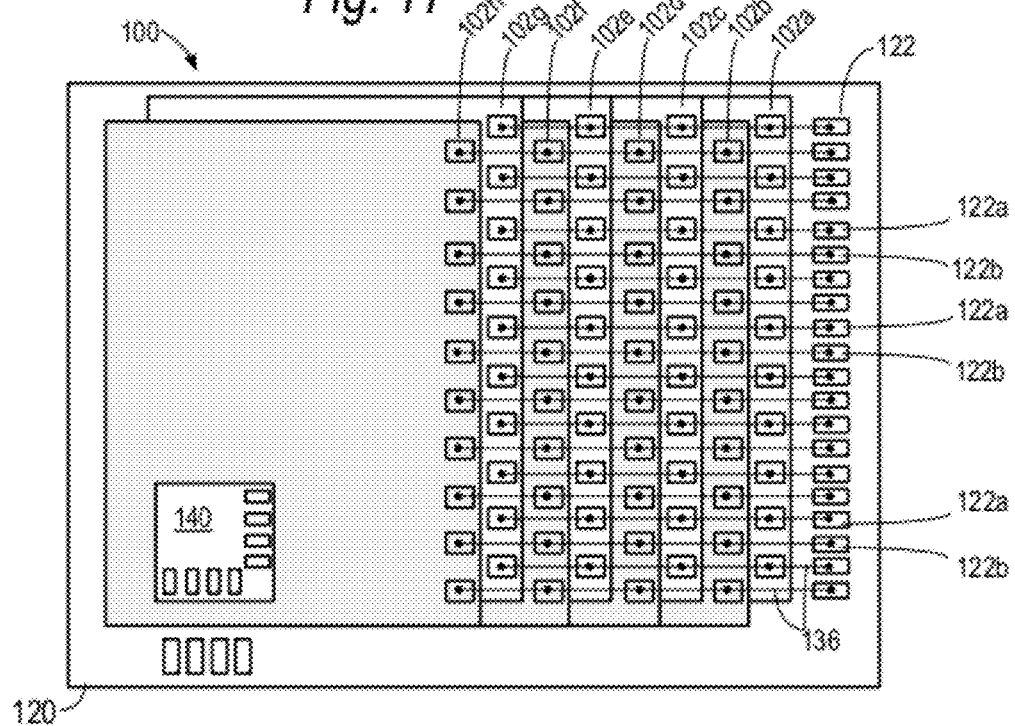
FIG. 17 is a top view of a semiconductor package during a fourth phase of fabrication according to the present technology.
Figure 18:
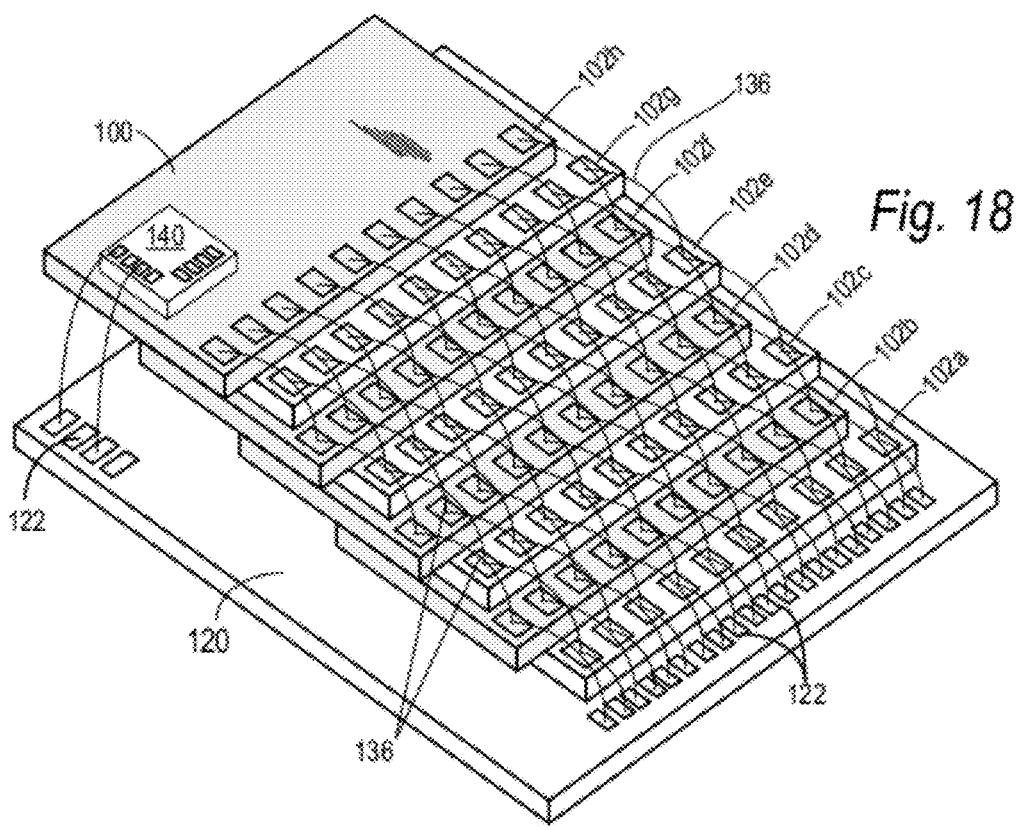
FIG. 18 is a perspective view of a semiconductor package during a fourth phase of fabrication according to the present technology.

Referring now to the top and perspective views of FIGS. 17 and 18, once all die 102 have been provided in the die stack, a controller die 140 may be affixed atop the stack in step 228. Controller die 140 may for example be an ASIC, but may be other controller die in further embodiments. In step 232, the controller die 140 may be wire bonded to contact pads 122 on the substrate 120 (only some wire bonds are shown in FIGS. 17 and 18 for clarity). In the example shown, the controller die 140 may have die bond pads off two adjacent edges of the die, which are bonded to contact pads 122 on adjacent edges of the substrate 120. The controller die 140 may have die bond pads along a single edge or greater than two edges in further embodiments.

Figure 19:
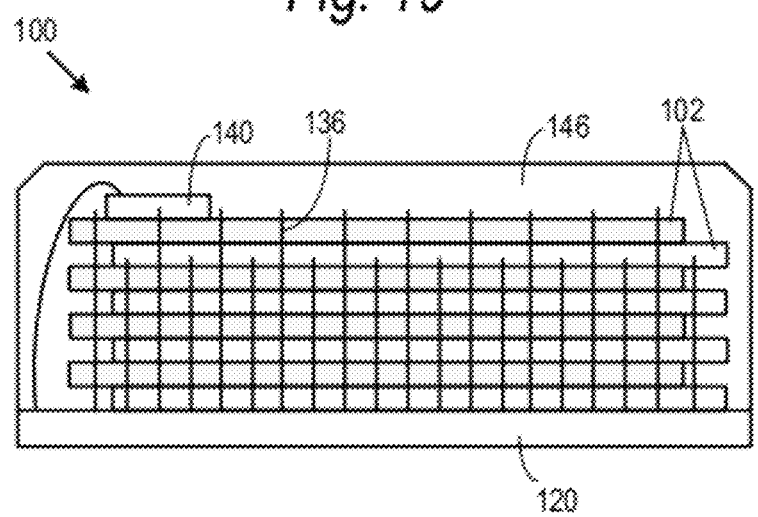
FIG. 19 is an edge view of a finished semiconductor package according to the present technology encapsulated with a molding compound.

Referring now to the edge view of FIG. 19, after the die stack is formed and wire bonded to bond pads on the substrate 120, the die stack may be encased within the molding compound 146 in step 236. The encapsulated packages may then be singulated from the substrate panel in step 240, to form finished semiconductor die packages 100. Molding compound 146 may be a known epoxy resin such as for example available from Sumitomo Corp. and Nitto Denko Corp., both having headquarters in Japan. In some embodiments, the finished package 100 may optionally be enclosed within a lid in step 242.

Figure 20:
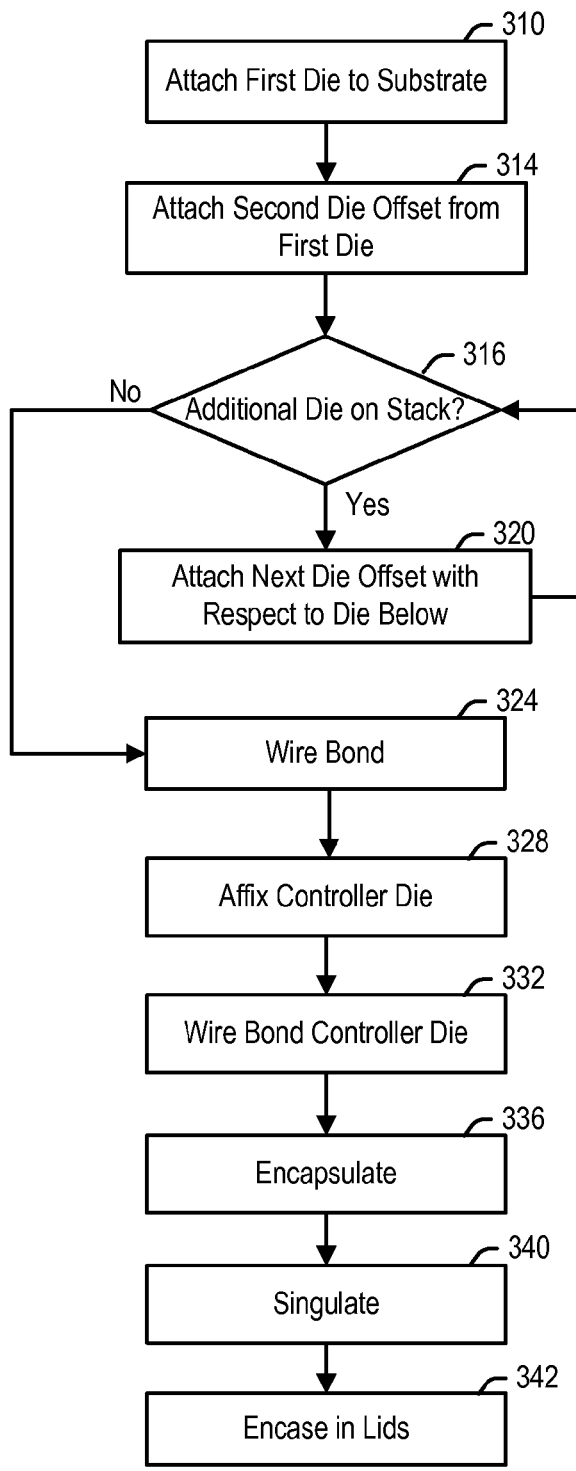
FIG. 20 is a flowchart for assembling a semiconductor package according to an alternative embodiment of the present invention.
Figure 21:
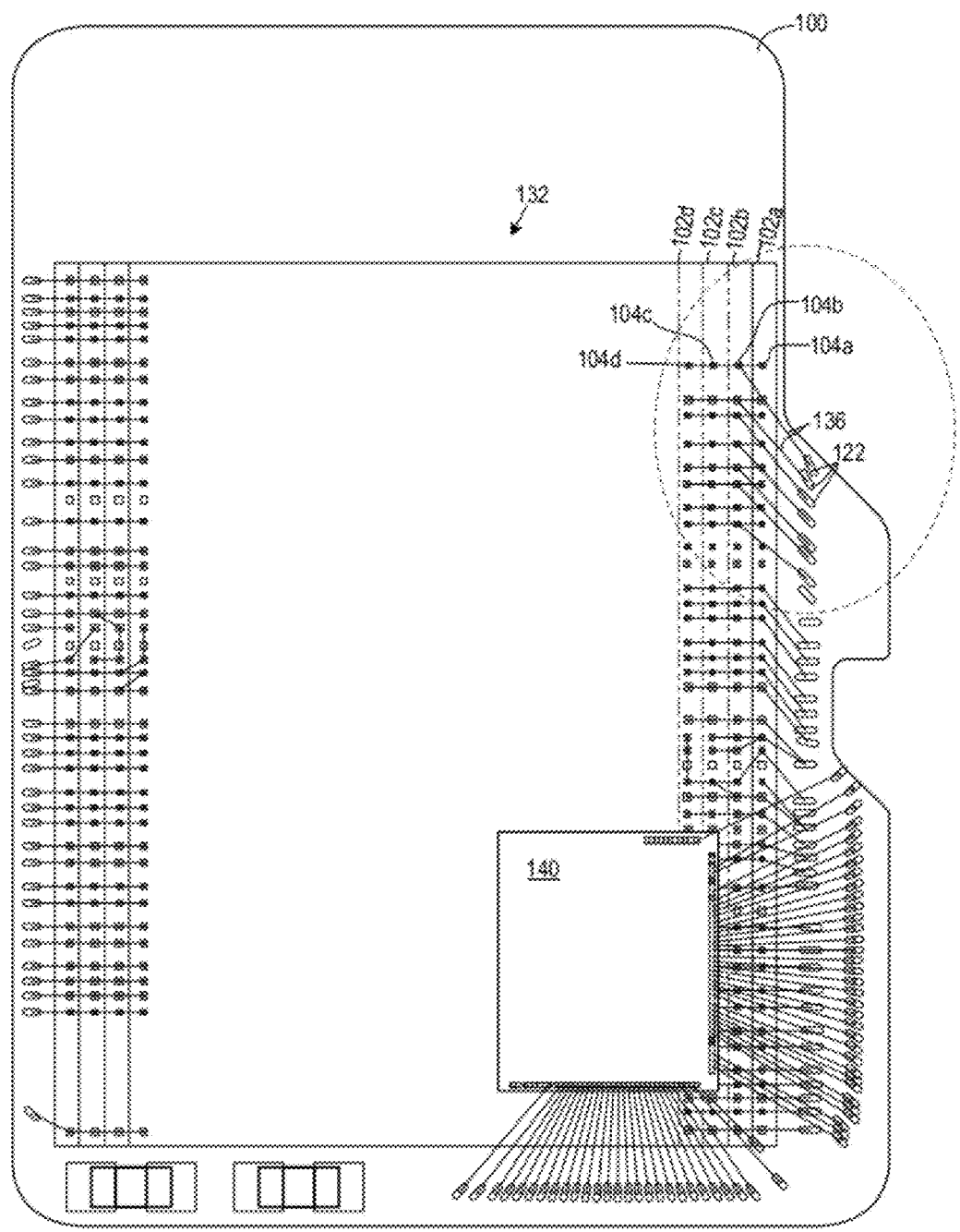
FIG. 21 is a top view of an irregular shaped semiconductor die package wire bonded according to a further embodiment of the present technology.
Figure 22:
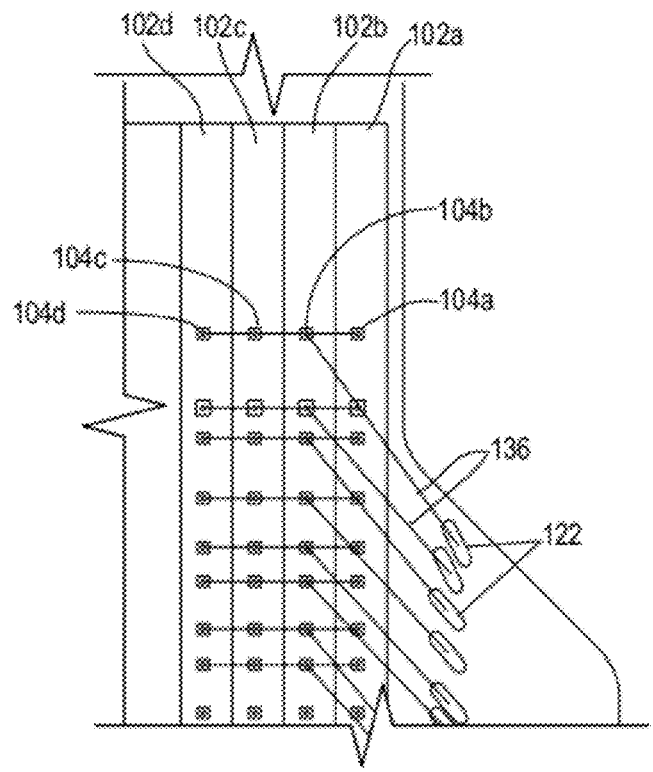
FIG. 22 is an enlarged view of a portion of the semiconductor package of FIG. 21 illustrating the wire bonding according to an embodiment of the present technology.
Figure 24:
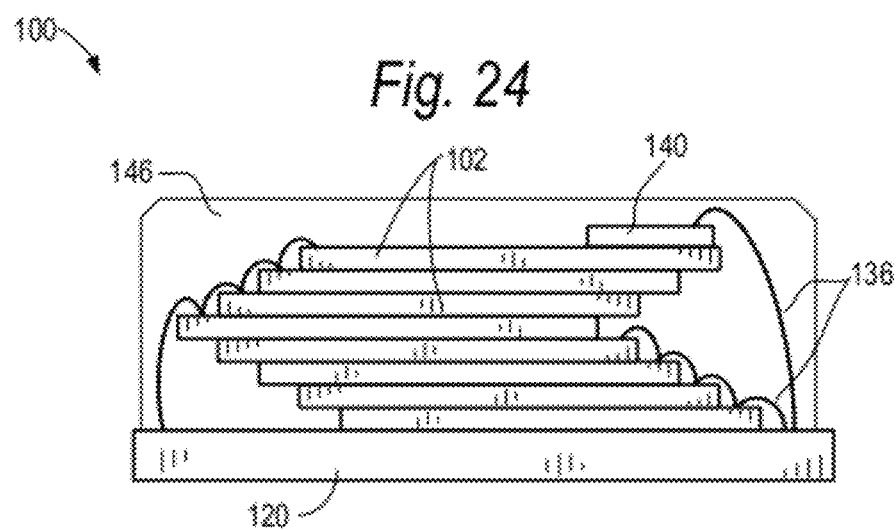
FIG. 24 is a side view of a finished semiconductor package according to an embodiment of the present technology encapsulated within a molding compound.

As set forth in the Background section, for irregular shaped packages, it may happen that some wires along an irregular-shaped portion of the package get molded outside of the package, or too close to the edge of the package. FIG. 20 is a flowchart of a further embodiment of the present technology for solving this problem. In steps 310, 314, 316 and 320, the die may be stacked on the substrate. For example, FIGS. 21 and 24 show top and end views of a die stack 132 including a number of die 102a-102h attached to the substrate 120. As shown in the top view of FIG. 21, the substrate 120 may have an irregular shape, such as for example the shape of a microSD memory package. The substrate may have an irregular shape when the die 102 are mounted on the substrate 120, or the substrate may be formed into the irregular shape after the die are mounted on the substrate.

In the current embodiment, the die may be mounted using die stack rotation along the x-axis, as shown in FIG. 24. However, it is understood that the die may be stacked using a straight offset along the x-axis (such as shown in FIGS. 13 and 14). In the current embodiment, the die need not be staggered along the y-axis, though it is conceivable that the die are y-axis-staggered in further embodiments.

In step 324, the die may be wire bonded to each other and to contact pads 122 on the substrate 120. The bottom die 102a has die bond pads 104a, die 102b has bond pads 104b, die 102c has bond pads 104c, etc. As noted above, die bond pads 104a, 104b, 104c, etc., on respective die which correspond with each other along the y-axis may be wire bonded to each other.

In accordance with the current embodiment, instead of wire bonding to the substrate 120 from the die bond pad 104a of the bottom die 102a, one or more wire bonds 136 may be made to the substrate 120 from the bond pads on the die which are higher up in the stack 132. Thus, for example, wire bonds 136 may be made to substrate 120 from die bond pads 104b on die 102b. As shown in FIG. 21 and the enlarged view of FIG. 22, by bonding to the substrate 120 from a higher bond pad, e.g., bond pad 104b, the wire bonds all lie within the package outline, spaced from the edge of the package. In further embodiments, wire bonds may be made to the substrate from die above die 102b.

Figure 8:
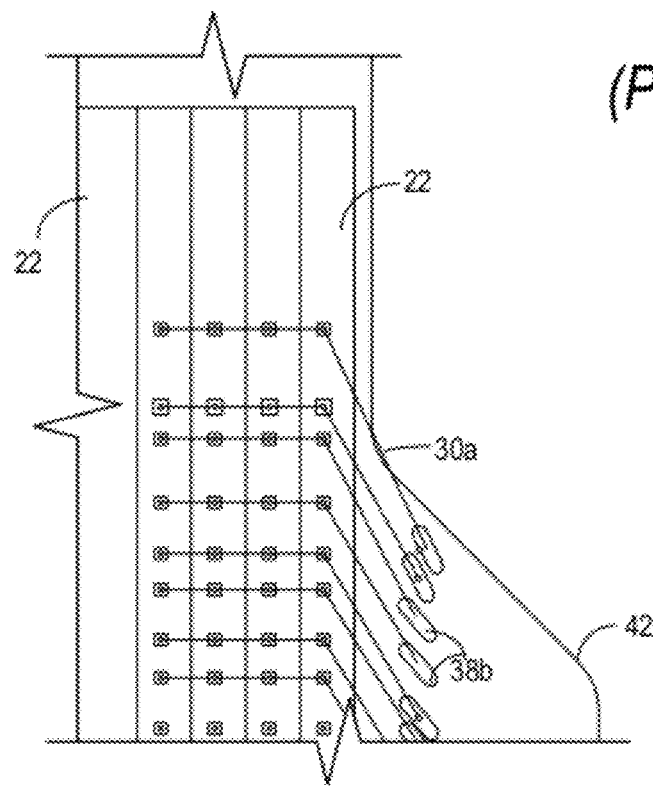
FIG. 8 is an enlarged prior art view of a portion of FIG. 7 showing a portion of a wire bond outside of the encapsulated package.
Figure 9:
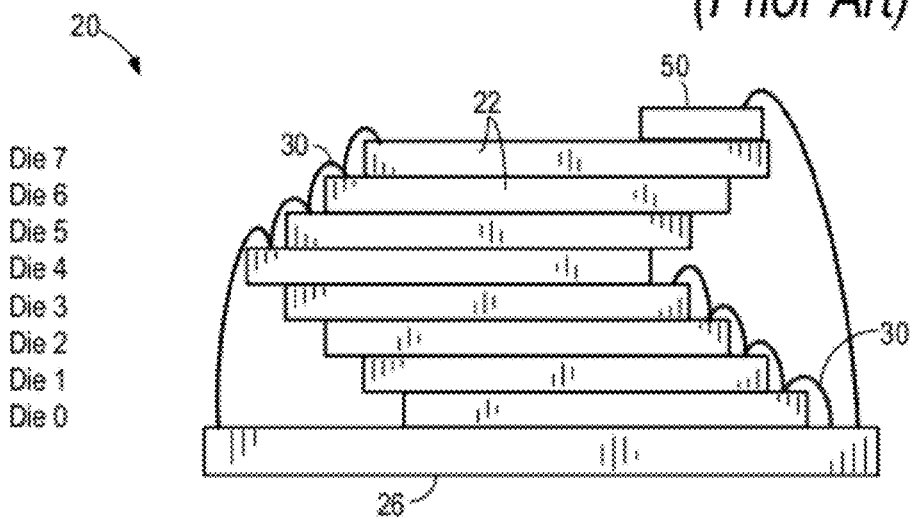
FIG. 9 is a prior art side view of the semiconductor package shown in FIG. 7.
Figure 23:
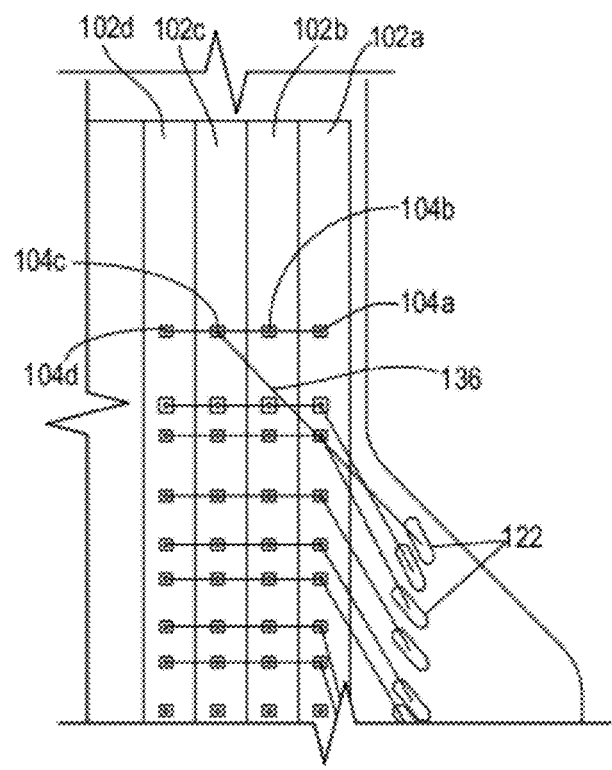
FIG. 23 illustrates a portion of the semiconductor package as in FIG. 22 according to a further embodiment of the present technology.

In embodiments, the wire bond to the substrate 120 may be made from the bond pad(s) of the lowest die which allow all wires to be encapsulated within the package, spaced from the edge of the package. In the example shown in prior art FIG. 8, only the uppermost wire bond (from the perspective of FIG. 9) was problematic. Accordingly, in such an example, only the uppermost wire bond may be moved to a higher die in the stack (as shown in the enlarged view of FIG. 23). In FIG. 23, the uppermost wire bond (from the perspective of FIG. 23) is made from a bond pad 104c on die 102c. The remaining wire bonds are made to the substrate from the bond pads 104a of the lowermost die 102a. Other wire bond configurations are contemplated where one or more of the wire bonds are made to the substrate from a die above the bottom die 102a.

Once wire bonding is performed in step 324 for this embodiment, the remaining steps may proceed as described above. In step 332, the controller die 140 may be wire bonded to contact pads 122 on the substrate 120 as shown in FIG. 21 and the end view of FIG. 24. Thereafter, the die stack may be encased within the molding compound 146 in step 336, and the encapsulated packages may then be singulated from the substrate panel in step 340, to form finished semiconductor die packages 100. In some embodiments, the finished package 100 may optionally be enclosed within a lid in step 342.

In any of the above-described embodiments, the semiconductor die 102 may be one or more flash memory chips so that, with controller die 140, the package 100 may be used as a flash memory device. It is understood that the package 100 may include semiconductor die configured to perform other functions in further embodiments of the present system. The package 100 in at least some of the embodiments described above may be used in a plurality of standard memory cards, including without limitation a CompactFlash card, a SmartMedia card, a Memory Stick, a Secure Digital card, a miniSD card, a microSD card, a USB memory card and others.

In embodiments, the present technology relates to a semiconductor device, including: a substrate; a first semiconductor die mounted on the substrate and having a first set of die bond pads, an x-axis and a y-axis being parallel with orthogonal edges of the first semiconductor die; a second semiconductor die mounted on top of the first semiconductor die and having a second set of die bond pads, the second semiconductor die being offset along the x-axis with respect to the first semiconductor die, and the second semiconductor die being staggered along the y-axis with respect to the first semiconductor die; a first set of wire bonds between the first set of die bond pads and the substrate; and a second set of wire bonds between the second set of die bond pads and the substrate, the first and second sets of wire bonds interspersed with each other.

In further embodiments, the present technology relates to a semiconductor device, including: a substrate; a first semiconductor die mounted on the substrate, an x-axis and a y-axis being defined parallel with orthogonal edges of the first semiconductor die; a second semiconductor die mounted on top of the first semiconductor die, the second semiconductor die being offset along the x-axis with respect to the first semiconductor die, and the second semiconductor die being staggered along the y-axis with respect to the first semiconductor die; and a third semiconductor die mounted on top of the second semiconductor die, the third semiconductor die being offset along the x-axis with respect to the second semiconductor die, and the third semiconductor die being staggered along the y-axis to align with the first semiconductor die along the y-axis.

Another embodiment of the present technology relates to a semiconductor device, comprising: a substrate; a first group of semiconductor die mounted on the substrate, each semiconductor die in the first group of semiconductor die having a first set of die bond pads, an x-axis and a y-axis being defined parallel to orthogonal edges of the semiconductor die in the first group of semiconductor die; a second group of semiconductor die mounted on the substrate, each semiconductor die in the second group of semiconductor die having a second set of die bond pads, semiconductor die from the first and second groups mounted on the substrate interspersed with each other, with semiconductor die from the first and second groups offset with respect to each other along the x-axis, and with semiconductor die from the first group staggered along the y-axis with respect to semiconductor die from the second group; a first set of wire bonds electrically coupling corresponding die bond pads of the first set of die bond pads of the first group of die; and a second set of wire bonds electrically coupling corresponding die bond pads of the second set of die bond pads of the second group of die, the first and second sets of wire bonds interspersed with each other.

A still further embodiment of the present technology relates to a semiconductor device including an irregular shaped edge, including: a substrate having a contact pad adjacent the irregular shaped edge; a plurality of semiconductor die forming a die stack attached to the substrate, a lowermost semiconductor die attached directly to the substrate and remaining semiconductor die of the die stack attached to the lowermost semiconductor die; a plurality of corresponding die bond pads, one each on the plurality of semiconductor die, the plurality of corresponding die bond pads corresponding to each other on the plurality of semiconductor die; a set of wire bonds electrically coupling the plurality of corresponding die bond pads to each other, the set of wire bonds including a wire bond to the substrate contact pad from a die bond pad of a semiconductor die above the lowermost semiconductor die, where a straight line between the die bond pad of the lowermost semiconductor die and the substrate contact pads includes a portion outside the irregular shaped edge of the semiconductor device.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a substrate including a single row of aligned contact pads;
   a first semiconductor die mounted on the substrate and having a first set of die bond pads, an x-axis and a y-axis being parallel with orthogonal edges of the first semiconductor die;
   a second semiconductor die mounted on top of the first semiconductor die and having a second set of die bond pads, the second semiconductor die being offset along the x-axis with respect to the first semiconductor die, and the second semiconductor die being staggered along the y-axis with respect to the first semiconductor die;
   a first set of wire bonds between the first set of die bond pads and contact pads in the single row of contact pads on the substrate; and a second set of wire bonds between the second set of die bond pads and contact pads in the single row of contact pads on the substrate, the first and second sets of wire bonds interspersed with each other.

2. The semiconductor device of claim 1, wherein the first and second semiconductor die are flash memory semiconductor die.

3. The semiconductor device of claim 1, wherein the first and second semiconductor die are NAND semiconductor die.

4. The semiconductor device of claim 1, further comprising a controller die mounted on the second semiconductor die and electrically connected to the substrate.

5. The semiconductor device of claim 4, further comprising molding compound surrounding at least the first and second semiconductor die, the first and second sets of wire bonds and the controller die.

6. The semiconductor device of claim 1, wherein the substrate is one of a printed circuit board, a leadframe and a tape automated bonded tape.

7. The semiconductor device of claim 1, the package comprising one of a CompactFlash card, a SmartMedia card, a Memory Stick, a Secure Digital card, a miniSD card, a microSD card, and a USB memory card.

8. The semiconductor device of claim 1, wherein at least one of the first and second sets of wire bonds are electrically insulated.

\* \* \* \* \*